US009029897B2

(12) United States Patent
Choi et al.

(10) Patent No.: US 9,029,897 B2
(45) Date of Patent: May 12, 2015

(54) ORGANIC LIGHT EMITTING DIODE AND ORGANIC LIGHT EMITTING DIODE DISPLAY

(71) Applicant: Samsung Display Co., Ltd., Yongin, Gyeonggi-Do (KR)

(72) Inventors: Hae-Yun Choi, Yongin (KR); Soo-Min Baek, Yongin (KR); Won-Gyun Kim, Yongin (KR); Min-Woo Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 110 days.

(21) Appl. No.: 13/950,128

(22) Filed: Jul. 24, 2013

(65) Prior Publication Data
US 2014/0103308 A1    Apr. 17, 2014

(30) Foreign Application Priority Data

Oct. 12, 2012  (KR) .......................... 10-2012-0113462

(51) Int. Cl.
*H01L 33/00* (2010.01)
*H01L 51/52* (2006.01)
*H01L 33/38* (2010.01)

(52) U.S. Cl.
CPC ........ *H01L 51/5262* (2013.01); *H01L 51/5209* (2013.01); *H01L 33/38* (2013.01)

(58) Field of Classification Search
CPC . H01L 51/5209; H01L 51/52; H01L 51/5275; H01L 51/5262; H01L 33/36; H01L 33/38

USPC ....................... 257/40, 98, E51.021, E51.019
See application file for complete search history.

(56) References Cited

U.S. PATENT DOCUMENTS

| | | | |
|---|---|---|---|
| 2008/0180024 A1* | 7/2008 | Kwon | 313/504 |
| 2010/0033087 A1* | 2/2010 | Kim et al. | 313/504 |
| 2010/0109013 A1* | 5/2010 | Ahn et al. | 257/72 |
| 2010/0117523 A1* | 5/2010 | Tchakarov | 313/504 |
| 2010/0171107 A1* | 7/2010 | Jung et al. | 257/40 |
| 2011/0101353 A1* | 5/2011 | Park et al. | 257/59 |
| 2012/0327331 A1* | 12/2012 | Yim et al. | 349/62 |
| 2013/0049028 A1* | 2/2013 | Kim et al. | 257/88 |
| 2014/0027729 A1* | 1/2014 | So et al. | 257/40 |
| 2014/0062290 A1* | 3/2014 | Kim | 313/504 |
| 2014/0062292 A1* | 3/2014 | Seong | 313/504 |

(Continued)

FOREIGN PATENT DOCUMENTS

| | | |
|---|---|---|
| JP | 2002-124373 | 4/2002 |
| KR | 10-0521272 | 10/2005 |
| KR | 10-0669686 | 1/2007 |

OTHER PUBLICATIONS

Korean Patent Abstracts Publication No. 10-2004-0055223 A, dated Jun. 26, 2004, for KR 10-0521272, 2 pages.

(Continued)

*Primary Examiner* — Joseph C Nicely
(74) *Attorney, Agent, or Firm* — Christie, Parker & Hale, LLP

(57) ABSTRACT

An organic light emitting element including: a first electrode; a bump partially covering an end of the first electrode and having an island shape, which has a thickness larger than a thickness of the first electrode; an organic emission layer on the first electrode and the bump; and a second electrode on the organic emission layer.

13 Claims, 12 Drawing Sheets

(56) References Cited

U.S. PATENT DOCUMENTS

2014/0070179 A1* 3/2014 Kim .............................. 257/40
2014/0084257 A1* 3/2014 Kim et al. ...................... 257/40
2014/0145585 A1* 5/2014 Choi et al. .................... 313/504

OTHER PUBLICATIONS

Korean Patent Abstracts Publication No. 10-2004-0019186 A, dated Mar. 5, 2004, for KR 10-0669686, 2 pages.

* cited by examiner

1000

(a)

(b)

ORGANIC LIGHT EMITTING DIODE AND ORGANIC LIGHT EMITTING DIODE DISPLAY

CROSS-REFERENCE TO RELATED PATENT APPLICATION

This application claims priority to and the benefit of Korean Patent Application No. 10-2012-0113462 filed in the Korean Intellectual Property Office on Oct. 12, 2012, the entire content of which is incorporated herein by reference.

BACKGROUND

1. Field

The described technology relates generally to an organic light emitting element and an organic light emitting diode (OLED) display.

2. Description of the Related Art

Recently, organic light emitting diode (OLED) displays have received much attention.

Organic light emitting diode (OLED) displays may include an organic light emitting element (e.g., an organic light emitting diode) for emitting light to display an image. The organic light emitting element may include an organic emission layer positioned at an opening partitioned by a pixel definition layer, and a first electrode and a second electrode facing each on opposing sides of the organic emission layer.

Here, the organic emission layer, the first electrode, and the second electrode may respectively have different refractive indexes, and the organic emission layer may function as an optical fiber such that a portion of light emitted from the organic emission layer is reflected (e.g., continuously reflected) between the first electrode and the second electrode. Here, the light may be partially emitted into the pixel definition layer positioned at the side of the organic emission layer. However, this deteriorates a luminous efficiency of the entire organic light emitting diode (OLED) display.

The above information disclosed in this Background section is only for enhancement of understanding of the background of the described technology and, therefore, it may contain information that does not form the prior art that is already known in this country to a person of ordinary skill in the art.

SUMMARY

An exemplary embodiment provides an organic light emitting diode (OLED) display with improved luminous efficiency.

An organic light emitting element according to a first aspect of the present invention includes: a first electrode; a bump partially covering an end of the first electrode and having an island shape, which has a thickness larger than a thickness of the first electrode; an organic emission layer on the first electrode and the bump; and a second electrode on the organic emission layer.

The first electrode may be light transmissive, and the second electrode may be light reflective.

The bump may have a small refractive index as compared with a refractive index of the organic emission layer and a refractive index of the first electrode.

The bump may have a refractive index of about 1.5 to about 1.6.

A thickness of the bump may be in a range of about 0.8 μm to about 3.5 μm.

A width of the bump may be in a range of about 5 μm to about 6 μm.

The bump may have a curved surface.

According to an embodiment of the present invention, the curved surface of the bump, which contacts a surface of the first electrode, and the surface of the first electrode form an angle of about 38 degrees to about 80 degrees.

The curved surface of the bump may include: a first sub-curved surface contacting the surface of the first electrode and forming a first angle with the surface of the first electrode; and a second sub-curved surface that has a bend, extends from the first sub-curved surface, and forms a second angle with the surface of the first electrode that is larger than the first angle.

The first angle may be in a range of about 10 degrees to about 37 degrees, and the second angle may be in a range of about 38 degrees to about 80 degrees.

The bump may include: a first sub-bump having a first sub-curved surface; and a second sub-bump on the first sub-bump and having a second sub-curved surface.

The first sub-bump and the second sub-bump may have different refractive indexes.

The organic emission layer may be configured to emit white light.

The first electrode, the organic emission layer, and the second electrode respectively may have different refractive indexes.

According to another aspect of the present invention, there is provided an organic light emitting diode (OLED) display including: a substrate; and an organic light emitting element on the substrate and including: a first electrode; a bump partially covering an end of the first electrode and having an island shape, which has a thickness larger than a thickness of the first electrode; an organic emission layer on the first electrode and the bump; and a second electrode on the organic emission layer.

The organic light emitting diode display may further include a color filter layer between the substrate and the organic light emitting element.

According to an exemplary embodiment, an organic light emitting diode (OLED) display with improved luminous efficiency is provided.

DETAILED DESCRIPTION

Figure 1:
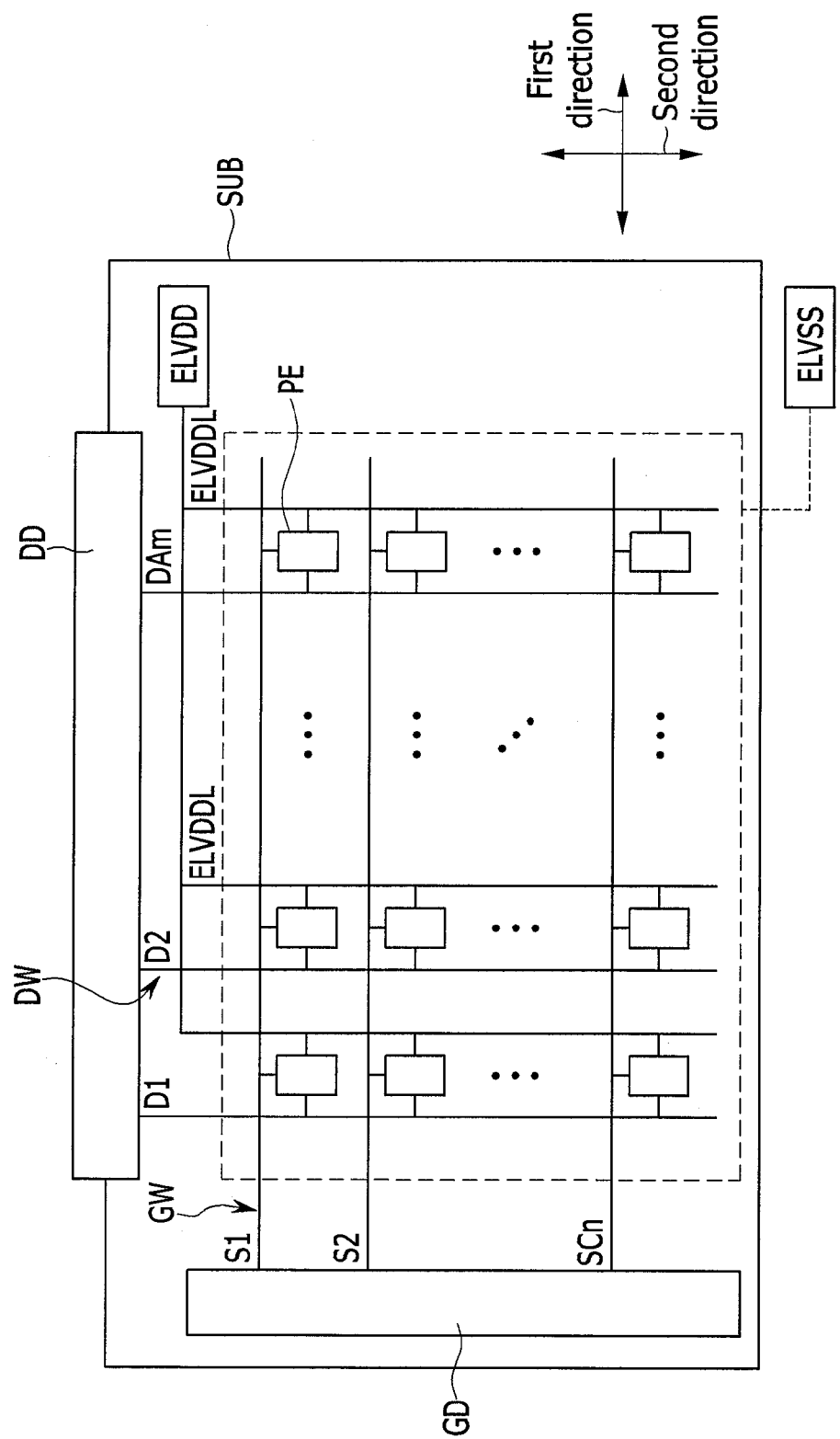
FIG. 1 is a schematic view of an organic light emitting diode (OLED) display according to the first exemplary embodiment.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. In the drawings, the thickness of layers, films, panels, regions, etc., may be exaggerated for clarity. For example, in the drawings, for better understanding and ease of description, the thicknesses of some layers and areas may be exaggerated. It will be understood that when an element such as a layer, film, region, or substrate is referred to as being "on" another element, it can be directly on the other element or one or more intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Next, an organic light emitting diode (OLED) display according to the first exemplary embodiment will be described with reference to FIG. 1 to FIG. 5.

FIG. 1 is a schematic view of an organic light emitting diode (OLED) display according to the first exemplary embodiment.

As shown in FIG. 1, an organic light emitting diode (OLED) display 1000 according to the first exemplary embodiment includes a substrate SUB, a gate driver GD, gate wires GW, a data driver DD, data wires DW, and a pixel PE. Here, the pixel PE is a minimum unit for displaying an image, and the organic light emitting diode (OLED) display 1000 displays the image through a plurality of pixels PE.

The substrate SUB may be formed of a transparent light transmission substrate, for example, it may be made of glass, quartz, ceramic, or plastic. However, the first exemplary embodiment is not restricted thereto, for example, the substrate SUB may also be formed as a metallic substrate made of stainless steel. Further, when the substrate SUB is made of plastic, the organic light emitting diode (OLED) display 1000 can be flexible, rollable, or stretchable.

The gate driver GD sequentially supplies a scan signal to the gate wires GW corresponding to a control signal supplied by a control circuit (not shown), for example, a timing controller. The pixel PE is selected by the scan signal to sequentially receive a data signal.

The gate wires GW may be positioned on the substrate SUB and extend in the first direction. The gate wires GW may include scan lines S1-SCn, and the scan lines SCn may be connected to the gate driver GD to receive scan signals from the gate driver GD.

In the organic light emitting diode (OLED) display 1000 according to the first exemplary embodiment, the gate wires GW include the scan lines SCn, however, in an organic light emitting diode (OLED) display according to another exemplary embodiment, the gate wires may further include an additional scan line, an initial power source line, and a light emission control line. The organic light emitting diode (OLED) display can be an active matrix (AM) type of organic light emitting diode (OLED) display with a 6Tr-2Cap structure.

The data driver DD supplies a data signal to a data line DAm from among the data wires DW, corresponding to a control signal supplied by the timing controller. The data signal supplied to the data line DAm is supplied to the pixel PE selected by the scan signal when the scan signal is supplied to the scan line SCn. The pixel PE is charged with a voltage corresponding to the data signal and emits light with corresponding luminance.

The data wires DW may be positioned on the gate wires GW, however they may be positioned between the gate wires GW and the substrate SUB and may extend in the second direction crossing the first direction. The data wires DW may include the data lines DA1-DAm and a driving power source line ELVDDL. The data lines DAm are connected to the data driver DD and receive the data signal from the data driver DD. The driving power source line ELVDDL may be connected to the first power source ELVDD from the outside and may receive driving power from the first power source ELVDD.

The pixel PE is positioned at a region where the gate wires GW and the data wires DW are crossed, and is connected to the gate wires GW and the data wires DW. The pixel PE may include a first power source ELVDD, two thin film transistors and a capacitor connected to the gate wires GW and the data wires DW, and an organic light emitting element connected to the second power source ELVSS via the thin film transistor. The pixel PE is selected when the scan signal is supplied through the scan line SCn, it charges the voltage corresponding to the data signal through the data line DAm, and it emits light with predetermined luminance corresponding to the charged voltage.

Next, the pixel PE will be described with reference to FIG. 2 to FIG. 5.

Figure 2:
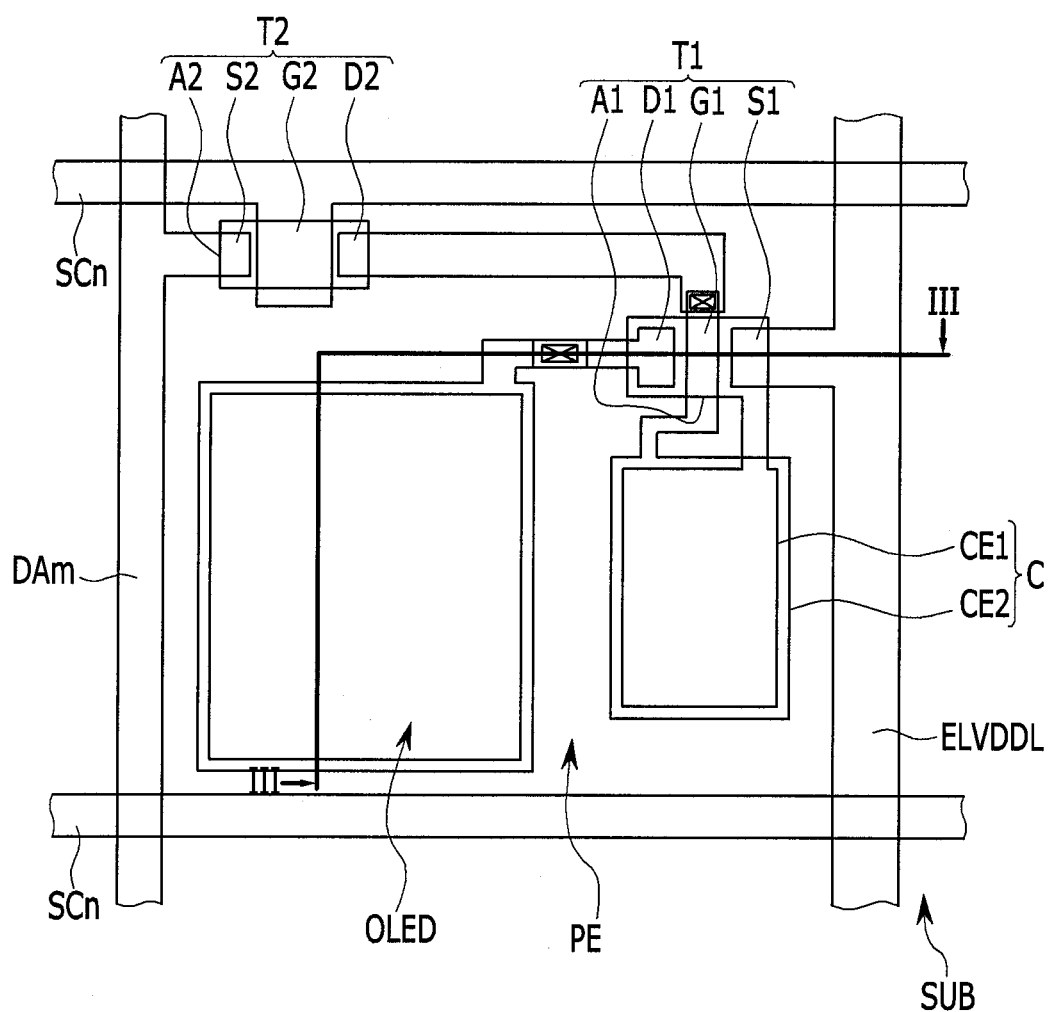
FIG. 2 is a schematic layout view of a pixel part shown in FIG. 1.

FIG. 2 shows a schematic layout view of a pixel part shown in FIG. 1.

Shown in FIG. 2 is a pixel PE that has a 2Tr-1 Cap structure in which an organic light emitting diode (OLED), two thin film transistors T1 and T2, and a capacitor C are disposed. However, in other embodiments, pixels can have different configurations, for example, a configuration in which at least three thin film transistors and at least two capacitors are disposed.

The organic light emitting diode (OLED) includes a first electrode that is an anode functioning as a hole injection electrode, a second electrode that is a cathode functioning as an electron injection electrode, and an organic emission layer disposed between the first electrode and the second electrode.

In detail, in the first exemplary embodiment, the display device includes a switching thin film transistor T2, a driving thin film transistor T1, and a capacitor C formed for each pixel PE.

The switching thin film transistor T2 includes a switching gate electrode G2, a switching active layer A2, a switching source electrode S2, and a switching drain electrode D2.

The switching gate electrode G2 is connected to the scan line SCn. The switching active layer A2 is positioned corresponding to the switching gate electrode G2, and the switching source electrode S2 and the switching drain electrode D2 are respectively connected to each end thereof. The switching source electrode S2 is connected to the data line DAm. The switching drain electrode D2 is separated from the switching source electrode S2 via the switching gate electrode G2 interposed therebetween, and is connected to the second capacitor electrode CE2 of the capacitor C via the driving gate electrode G1 of the driving thin film transistor T1.

The driving thin film transistor T1 includes a driving gate electrode G1, a driving active layer A1, a driving source electrode S1, and a driving drain electrode D1.

The driving gate electrode G1 is connected to the switching drain electrode D2 of the switching thin film transistor T2 and the second capacitor electrode CE2 of the capacitor C. The driving active layer A1 is connected to the first capacitor electrode CE1 of the capacitor C. The driving source electrode S1 and the driving drain electrode D1 are separated from each other via the driving gate electrode G1 interposed therebetween, and are respectively connected to both ends of the driving active layer A1. The driving source electrode S1 is connected to the driving power source line ELVDDL, and the driving drain electrode D1 is connected to the first electrode that is an anode of the organic light emitting element (OLED).

That is, the switching source electrode S2 of the switching thin film transistor T2 is connected to the data line DAm, and the switching gate electrode G2 of the switching thin film transistor T2 is connected to the scan line SCn. Also, a node is formed between the switching drain electrode D2 of the switching thin film transistor T2 and the capacitor C such that the switching drain electrode D2 of the switching thin film transistor T2 is connected to the second capacitor electrode CE2 of the capacitor C. The switching drain electrode D2 of the switching thin film transistor T2 is connected to the driving gate electrode G1 of the driving thin film transistor T1. The driving power source line ELVDDL is connected to the driving source electrode S1 of the driving thin film transistor T1, and the first electrode, which is the anode of the organic light emitting element (OLED), is connected to the driving drain electrode D1.

The capacitor C may include the first capacitor electrode CE1 and the second capacitor electrode CE2 facing each other via an insulation layer interposed therebetween. The first capacitor electrode CE1 may be connected to the driving power source line ELVDDL, and the second capacitor electrode CE2 may be connected to the second gate electrode G2 of the second thin film transistor T2 through the first gate electrode G1.

The switching thin film transistor T2 is used as a switch for selecting the pixel PE to be emitted. If the switching thin film transistor T2 is turned on (e.g., instantly turned on), power is supplied from the driving power source line ELVDDL to the first capacitor electrode CE1 of the capacitor C and concurrently (or simultaneously) the power is supplied to second capacitor electrode CE2 from the data line Dam through the switching thin film transistor T2, such that the capacitor C is charged. Here, the charge amount is proportional to the voltage applied from the data line DAm. In the state that the switching thin film transistor T2 is turned off, the gate potential of the driving thin film transistor T1 is increased according to the potential charged to the capacitor C. Also, the driving thin film transistor T1 is turned on if the gate potential is over the threshold voltage. Thus, the voltage applied to the driving power source line ELVDDL is applied to the organic light emitting element (OLED) through the driving thin film transistor T1 such that the organic light emitting element (OLED) emits light.

The above-noted configuration of the pixel (PE) is not restricted to the description, and is variable in many ways within a range that is easily modifiable by a person skilled in the art.

Next, the pixel PE of the organic light emitting diode (OLED) display 1000 according to the first exemplary embodiment, will be described with reference to FIG. 3 to FIG. 5.

Figure 3:
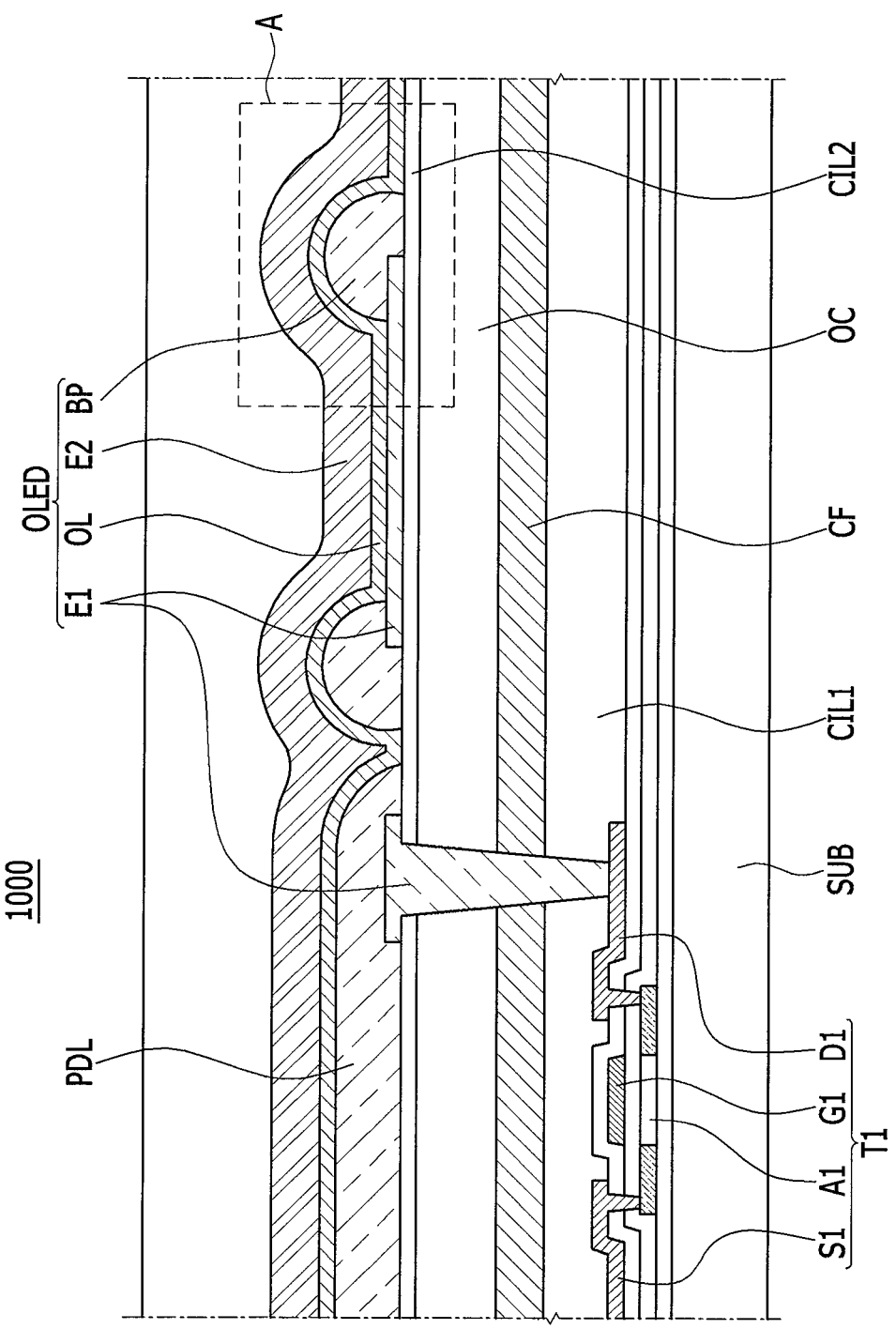
FIG. 3 is a schematic cross-sectional view taken along the line III-III of FIG. 2.

FIG. 3 is a schematic cross-sectional view taken along the line of FIG. 2.

As shown in FIG. 3, the pixel PE includes a substrate SUB, a driving thin film transistor T1, a first inorganic insulation layer CIL1, a color filter layer CF, an overcoat layer OC, a second inorganic insulation layer CIL2, and the organic light emitting element (OLED) that are sequentially deposited.

The driving thin film transistor T1 is positioned on the substrate SUB. A driving drain electrode D1 of the driving thin film transistor T1 is connected to the first electrode E1 of the organic light emitting element (OLED) through a contact hole. Here, the switching thin film transistor T1 and the capacitor C may be positioned at the same layer as the driving thin film transistor T1.

The first inorganic insulation layer CIL1 is positioned between the substrate SUB and the color filter layer CF and may include an inorganic material, such as silicon nitride SiNx or silicon oxide SiOx. The first inorganic insulation layer CIL1 may be formed as a single layer or as multiple layers. By positioning the first inorganic insulation layer CIL1 including the inorganic material between the substrate SUB and the color filter layer CF, moisture may be suppressed from penetrating into the organic light emitting element (OLED).

According to an embodiment of the present invention, the color filter layer CF corresponding to the organic light emitting element (OLED) is positioned between the overcoat layer OC and the first inorganic insulation layer CIL1. That is, the color filter layer CF is positioned between the substrate SUB and the organic light emitting element (OLED). The color filter layer CF may be positioned on the substrate SUB and correspond to a path through which the light emitted from the organic light emitting element (OLED) is emitted. That is, the color filter layer CF may be positioned on the substrate SUB and correspond to the path through which the image is emitted. The color filter layer CF, according to an embodiment, has a function of changing a wavelength of white light emitted from the organic light emitting element (OLED). The color filter layer CF may correspond to a color such as red, green, and blue, and may include an organic material.

The overcoat layer OC may cover the color filter layer CF to flatten protrusions and depressions formed by the color filter layer CF. The overcoat layer OC may include an organic material, such as an acryl-based material, parylene, and an epoxy resin-based material.

In FIG. 3, the second inorganic insulation layer CIL2 is positioned between the overcoat layer OC and the organic light emitting element (OLED). The second inorganic insulation layer CIL2 may include an inorganic material, such as silicon nitride SiNx or silicon oxide SiOx. The second inorganic insulation layer CIL2 may be formed with a single layer or multiple layers. By positioning the second inorganic insulation layer CIL2 including the inorganic material between the overcoat layer OC and the organic light emitting element (OLED), penetration of moisture from the outside into the organic light emitting element (OLED) through the color filter layer CF and the overcoat layer OC is suppressed.

Figure 4:
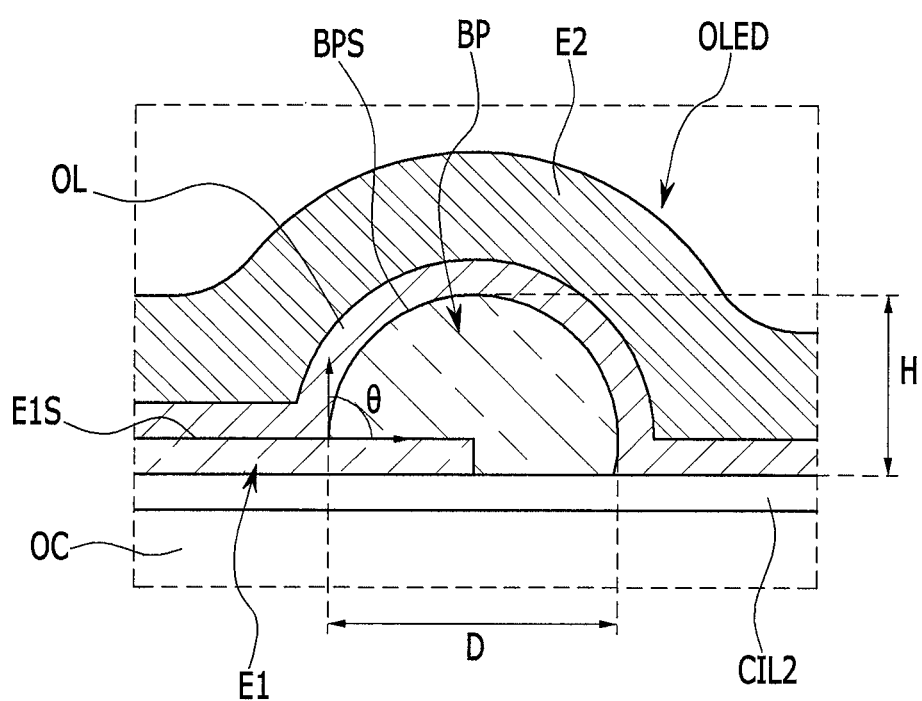
FIG. 4 is an enlarged schematic view of a portion A of FIG. 3.

FIG. 4 is an enlarged schematic view of a portion A of FIG. 3.

As shown in FIG. 3 and FIG. 4, the organic light emitting element (OLED) is on the second inorganic insulation layer CIL2, which is on the overcoat layer OC. The OLED may emit, for example, white light. According to an embodiment of the present invention, the organic light emitting element (OLED) includes a first electrode E1, bump BP, an organic emission layer OL, and a second electrode E2.

According to an embodiment of the present invention, the first electrode E1 is a light transmissive electrode, and the second electrode E2 is a light reflective electrode. Accordingly, the light emitted from the organic emission layer OL of the organic light emitting element (OLED) is reflected by the second electrode E2, is incident in the direction of the first electrode E1, and is emitted outside the substrate SUB through the color filter layer CF. That is, the organic light emitting diode (OLED) display 1000 according to the first exemplary embodiment is of a bottom light emitting type.

The first electrode E1, the organic emission layer OL, and the second electrode E2 have different refractive indexes according to the characteristics of the materials thereof, for example, the first electrode E1 may have a refractive index of 1.7 to 1.8.

Bumps BP may partially cover both ends of the first electrode E1, and a bump BP may have an island shape that is thickly protruded compared with the first electrode E1 (e.g., has a greater thickness than the first electrode). The bump BP may have a smaller refractive index than the organic emission layer OL and the first electrode E1. The refractive index of the bump BP may be, for example, 1.5 to 1.6.

The bump BP may have a thickness H of about 0.8 μm to about 3.5 μm and a width D of about 5 μm to about 6 μm, and when the bump BP has the above thickness H and width D, the luminous efficiency of the organic light emitting diode (OLED) display 1000 according to the first exemplary embodiment is improved. The luminous efficiency improvement of the organic light emitting diode (OLED) display 1000 according to the thickness H and the width D of the described bump BP is described with an experimental example that will be described later.

The bump BP may have a curved surface BPS, and the curved surface BPS of the bump BP, which may contact the surface E1S of the first electrode E1, and the surface E1S of the first electrode E1 may form an angle (θ). The angle (θ) may be about 38 degrees to about 80 degrees.

When the curved surface BPS of the bump BP has the angle (θ) of about 38 degrees to about 80 degrees with the surface E1S of the first electrode E1, the luminous efficiency of the organic light emitting diode (OLED) display 1000 according to the first exemplary embodiment is improved. The luminous efficiency improvement of the organic light emitting diode (OLED) display 1000 according to the angle (θ) between the curved surface BPS of the bump BP and the surface E1S of the first electrode E1 may be confirmed in an experimental example that will be described later.

Referring now to FIG. 3, a pixel definition PDL, which is separated from the bump BP, may be on the second inorganic insulation layer CIL2. The bump BP and the pixel definition PDL may be formed of the same material or of different materials.

The organic emission layer OL may emit white light by including three or more emission layers respectively emitting red, blue, and green, or by including an emission layer emitting white light. According to one embodiment, the organic emission layer OL covers the substrate SUB (e.g., the substrate in the pixel region or the entire substrate), and accordingly, the organic emission layer OL may be on the first electrode E1, the bump BP, and the pixel definition PDL. The organic emission layer OL may have a refractive index of 1.7 to 1.9.

According to an embodiment, the second electrode E2 is on the organic emission layer OL and covers the substrate SUB (e.g., the substrate in the pixel region or the entire substrate). The second electrode E2 may be the light reflective electrode.

In the organic light emitting element (OLED), holes and electrons are respectively injected inside the organic emission layer OL from the first electrode E1 and the second electrode E2, and if exitons (formed when the holes and the electrons injected into the organic emission layer OL are combined) shift from an excited state to a ground state, the organic emission layer OL emits light.

Here, the organic light emitting diode (OLED) display 1000 according to the first exemplary embodiment includes the first inorganic insulation layer CIL1 and the second inorganic insulation layer CIL2, however the organic light emitting diode (OLED) display according to another exemplary embodiment may omit the first inorganic insulation layer CIL1 and the second inorganic insulation layer CIL2.

Figure 5:
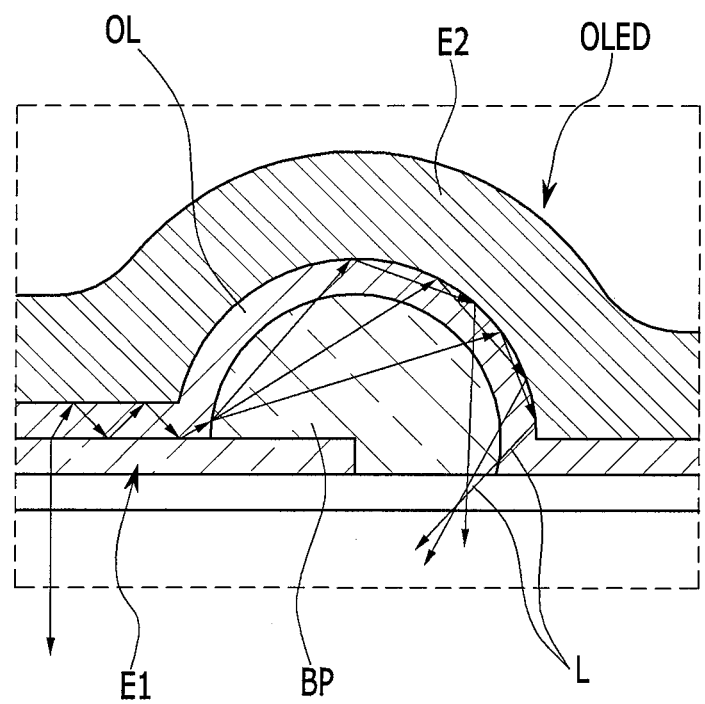
FIG. 5 is a schematic view showing a light path of light emitted from an organic emission layer shown in FIG. 4.

FIG. 5 is a schematic view showing a light path of light emitted from an organic emission layer shown in FIG. 4.

The organic emission layer OL of the organic light emitting element (OLED) of the organic light emitting diode (OLED) display 1000 according to the first exemplary embodiment has a different refractive index from the first electrode E1 and the second electrode E2 (e.g., due to the material characteristics). Accordingly, the organic emission layer OL functions as an optical fiber such that a portion of the light L emitted from the organic emission layer OL is continuously reflected between the first electrode E1 and the second electrode E2 and is emitted to the bump BP at the side of the organic emission layer OL. The light L emitted to the bump BP at the side of the organic emission layer OL is diffused in the interface of the bump BP, which has a smaller refractive index than that of the organic emission layer OL, and is irradiated onto the second electrode E2 positioned on the bump BP. By positioning the second electrode E2 (which is a reflective electrode) on the bump BP, the diffused light L is reflected by the second electrode E2 and is irradiated into the center portion of the pixel without luminance deterioration by the organic emission layer OL and the first electrode E1 such that the entire luminous efficiency of the organic light emitting diode (OLED) display 1000 is improved.

That is, in the organic light emitting diode (OLED) display 1000 according to the first exemplary embodiment, the light L irradiated into the side of the organic emission layer OL is reflected into the center of the pixel by the second electrode E2 without luminance deterioration by the organic emission layer OL and the first electrode E1, thereby improving the entire luminous efficiency.

Next, an experimental example to improve the luminous efficiency of the organic light emitting diode (OLED) display 1000 according to the first exemplary embodiment will be described with reference to FIG. 6 to FIG. 8. The experimental example has the same configuration as the organic light emitting diode (OLED) display according to the first exemplary embodiment.

Figure 6:
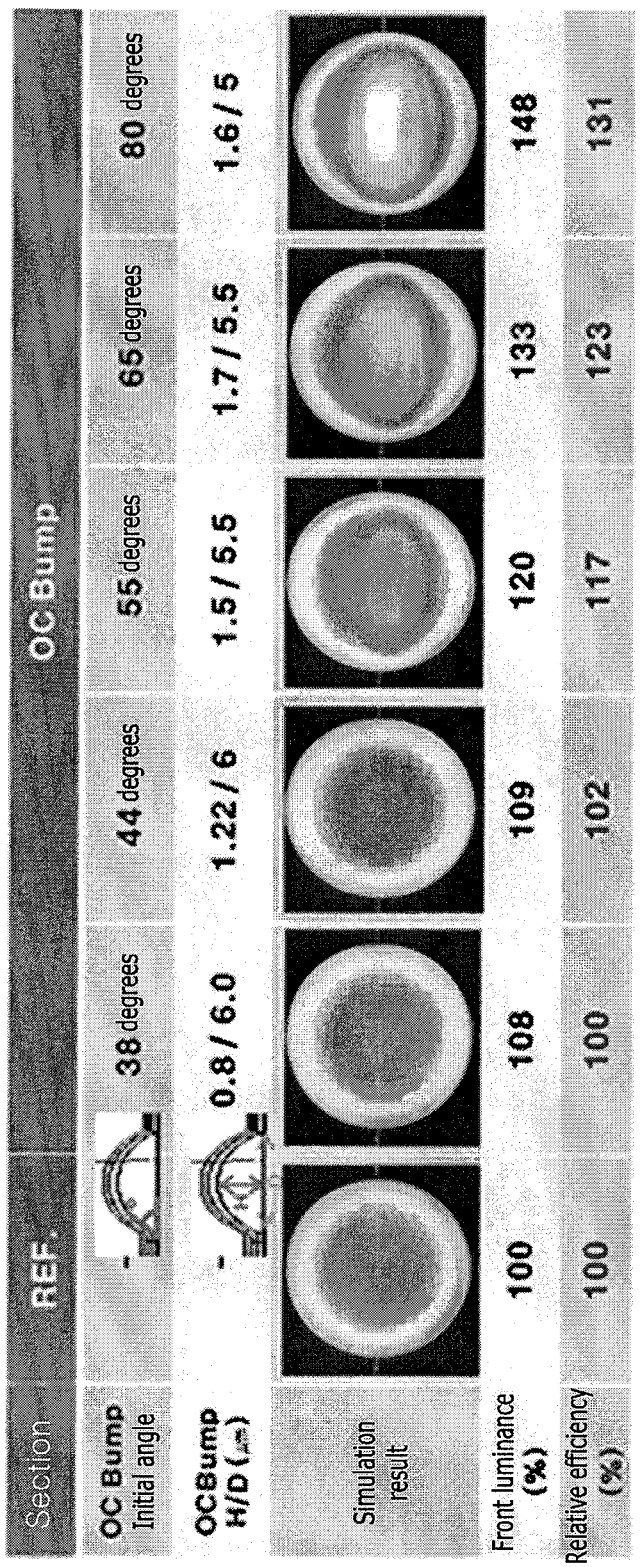
FIG. 6 and FIG. 7 are tables to describe aspects of an experimental example embodiment of the present invention.
Figure 7:
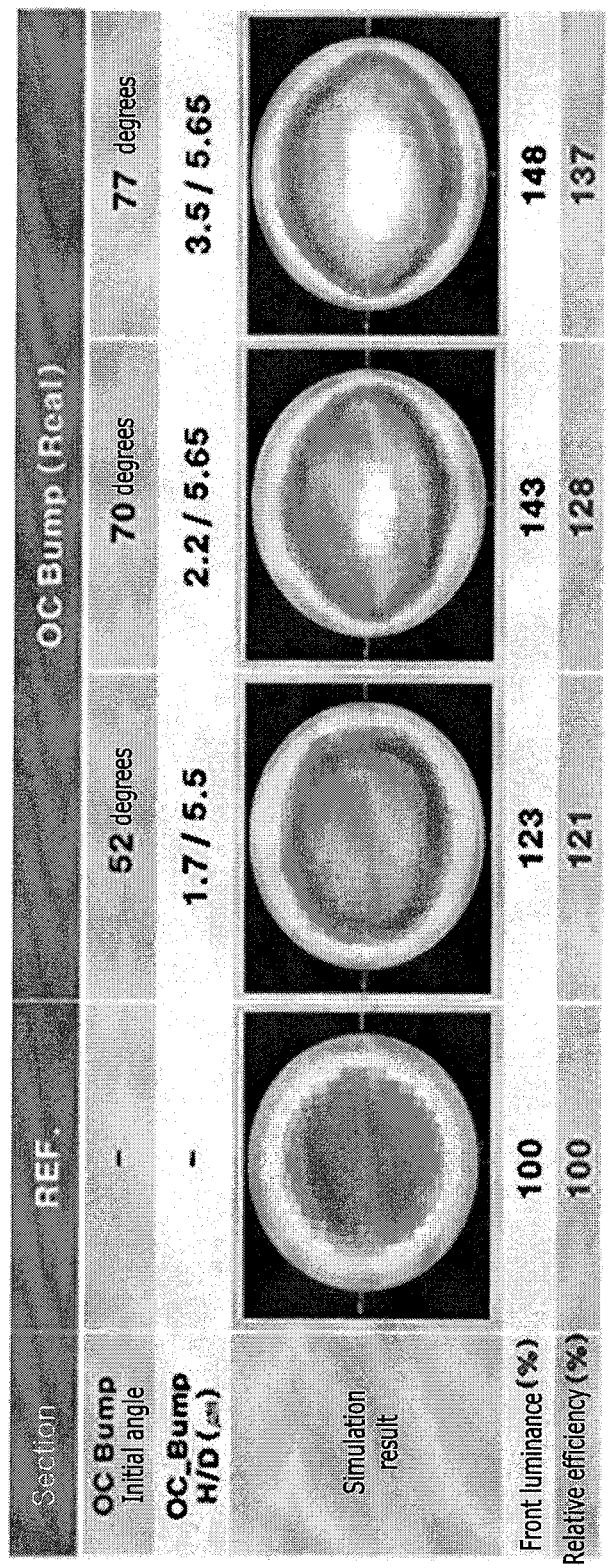

FIG. 6 and FIG. 7 are tables that describe aspects of an experimental example embodiment of the present invention. FIG. 8 is a graph that describes aspects of an experimental example embodiment of the present invention. In FIG. 6 to FIG. 8, a comparative example (REF.) is an organic light emitting diode (OLED) display in which the bump BP is omitted and a pixel definition layer covers both ends of the first electrode.

Figure 8:
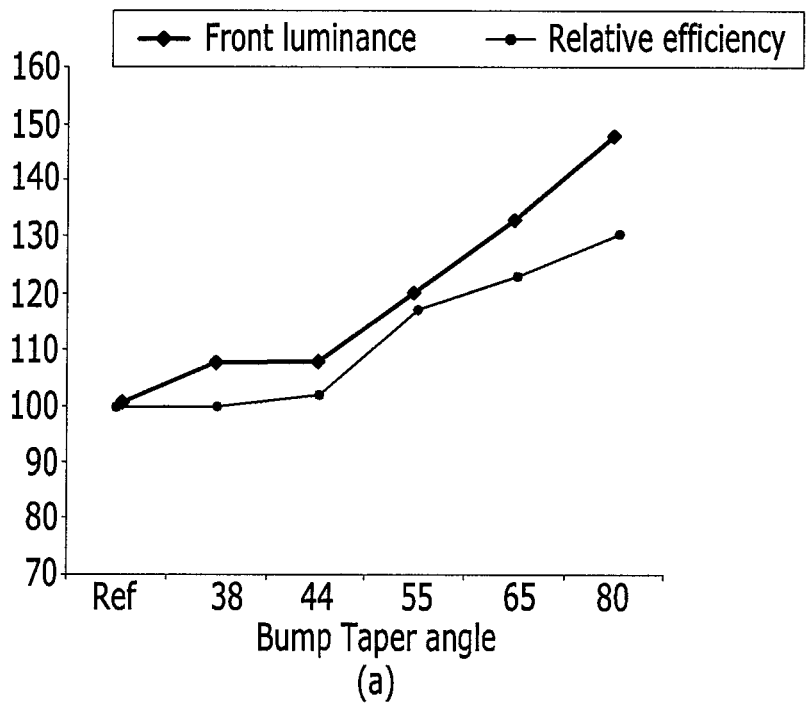
FIG. 8 is a graph to describe aspects of an experimental example embodiment of the present invention.
Figure 8:
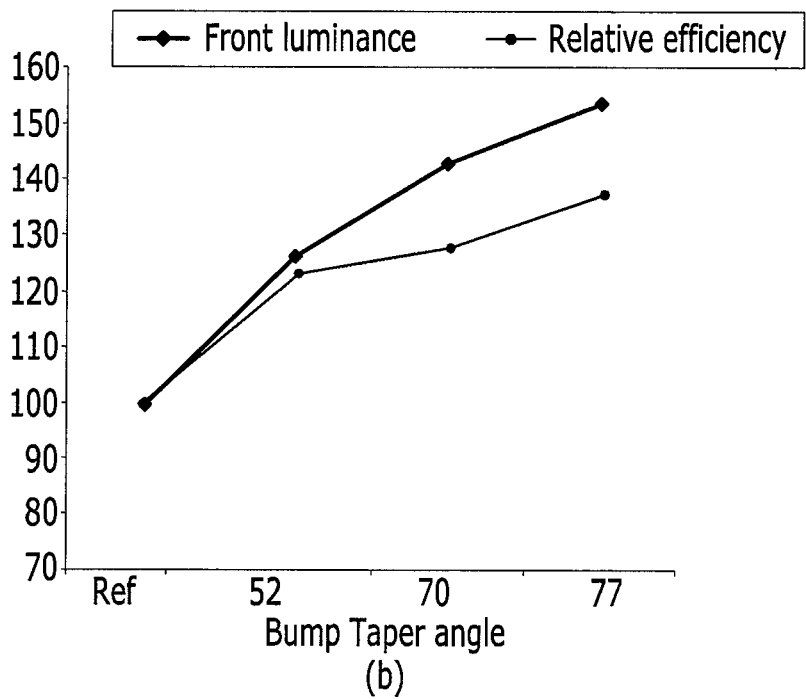

As shown in FIG. 6 to FIG. 8, compared with the comparative example (REF.), if the thickness H of the bump BP of an experimental example (OC Bump) is controlled to be about 0.8 μm to about 3.5 μm, the width D of the bump BP is controlled to be about 5 μm to be about 6 μm, and the angle between the curved surface BPS of the bump BP and the surface E1S of the first electrode E1 is controlled to be about 38 degrees to about 80 degrees, the front luminance and the relative efficiency may be improved in the experimental example embodiment (OC Bump) of the present invention compared with the comparative example (REF.).

In detail, as shown in FIG. 6 and FIG. 8 (a), an OC BUMP initial angle (the angle between the curved surface BPS of the bump BP and the surface E1S of the first electrode E1) is 38 degrees, and if an OC BUMP H/D (μm) (the thickness H of the bump BP and the width D) is set as 0.8/6.0, the front luminance of the experimental example (OC Bump) is improved by 8% as compared with the comparative example (REF.).

Next, if the OC BUMP initial angle (the angle between the curved surface BPS of the bump BP and the surface E1S of the first electrode E1) is 44 degrees and the OC BUMP H/D (μm) (the thickness H and the width D of the bump BP) is set to 1.22/6.0, the front luminance of the experimental example (OC Bump) is improved by 9% as compared with the comparative example (REF.) and the relative efficiency is improved by 2% as compared with the comparative example (REF.).

Next, if the OC BUMP initial angle (the angle between the curved surface BPS of the bump BP and the surface E1S) of the first electrode E1 is 55 degrees and the OC BUMP H/D (μm) (the thickness H and the width D of the bump BP) is 1.5/5.5, the front luminance of the experimental example (OC Bump) is improved by 20% as compared with the comparative example (REF.) and the relative efficiency is improved by 17% as compared with the comparative example (REF.).

Next, if the OC BUMP initial angle (the angle between the curved surface BPS of the bump BP and the surface E1S) of the first electrode E1 is 65 degrees and the OC BUMP H/D (μm) (the thickness H and the width D of the bump BP) is 1.7/5.5, the front luminance of the experimental example (OC Bump) is improved by 33% as compared with the comparative example (REF.) and the relative efficiency is improved by 23% as compared with the comparative example (REF.).

If the OC BUMP initial angle (the angle between the curved surface BPS of the bump BP and the surface E1S of the first electrode E1) is 80 degrees and the OC BUMP H/D (μm) (the thickness H and the width D of the bump BP) is 1.6/5.0, the front luminance of the experimental example (OC Bump) is improved by 48% as compared with the comparative example (REF.) and the relative efficiency is improved by 31% as compared with the comparative example (REF.).

In detail, as shown in FIG. 7 and FIG. 8 (b), if the OC BUMP initial angle (the angle between the curved surface BPS of the bump BP and the surface E1S of the first electrode E1) is 52 degrees, and if the OC BUMP H/D (μm) (the thickness H and the width D of the bump BP) is 1.7/5.5, the front luminance of the experimental example (OC Bump) is improved by 23% as compared with the comparative example (REF.), and the relative efficiency is improved by 21% as compared with the comparative example (REF.).

If the OC BUMP initial angle (the angle between the curved surface BPS of the bump BP and the surface E1S of the first electrode E1) is 70 degrees, and if the OC BUMP H/D (μm) as the thickness H and the width D of the bump BP is set to 2.2/5.65, the front luminance of the experimental example (OC Bump) is improved by 43% as compared with the comparative example (REF.), and the relative efficiency is improved by 28% as compared with the comparative example (REF.).

Next, if the OC BUMP initial angle (the angle between the curved surface BPS of the bump BP and the surface E1S of the first electrode E1) is 70 degrees, and if the OC BUMP H/D (μm) (the thickness H and the width D of the bump BP) is 3.2/5.65, the front luminance of the experimental example (OC Bump) is improved by 48% as compared with the comparative example (REF.), and the relative efficiency is improved by 37% as compared with the comparative example (REF.).

As confirmed in the above experimental example embodiments (OC Bump), in the organic light emitting diode (OLED) display 1000 according to the first exemplary embodiment, the bump BP may have a thickness H of about 0.8 μm to about 3.5 μm and a width D of about 5 μm to about 6 μm, and an angle between the curved surface BPS of the bump BP and the surface E1S of the first electrode E1 of about 38 degrees to about 80 degrees, thereby improving the luminous efficiency. That is, the organic light emitting diode (OLED) display 1000 with improved luminous efficiency is provided.

Next, an organic light emitting diode (OLED) display according to the second exemplary embodiment will be described with reference to FIG. 9 and FIG. 10.

Hereinafter, in describing the organic light emitting diode (OLED) display according to the second embodiment, elements or features that are different from the first exemplary embodiment will be described in detail, and elements or features that are the same or similar to the first exemplary embodiment are given by way of reference to the first exemplary embodiment. For better comprehension and ease of description, the elements of the second exemplary embodiment that are the same as (or similar to) the first exemplary embodiment have the same or similar reference numerals.

Figure 9:
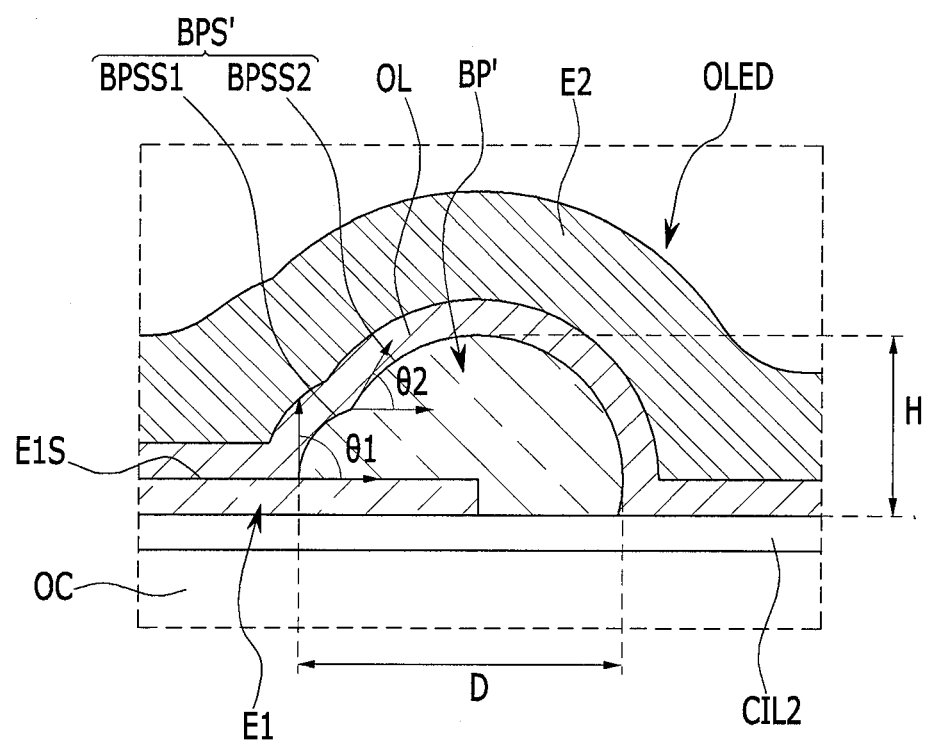
FIG. 9 is a schematic cross-sectional view partially showing an organic light emitting diode (OLED) display according to the second exemplary embodiment.

FIG. 9 is a schematic cross-sectional view of a portion of an organic light emitting diode (OLED) display according to the second exemplary embodiment.

As shown in FIG. 9, a bump BP' of the organic light emitting element (OLED) of the organic light emitting diode (OLED) display 1002 according to the second exemplary embodiment has a curved surface BPS'.

The curved surface BPS' of the bump BP' includes the first sub-curved surface BPSS1 contacting the surface E1S of the first electrode E1 and having the first angle θ1 with the surface E1S of the first electrode E1 and the second sub-curved surface BPSS2 that is bent and extended from the first sub-curved surface BPSS1 and having the second angle θ2 that is larger than the first angle θ1 by the surface E1S of the first electrode E1.

According to an embodiment of the present invention, the first angle θ1 of the first sub-curved surface BPSS1 is in the range of about 10 degrees to about 37 degrees, and the second angle θ2 of the second sub-curved surface BPSS2 is in the range of about 38 degrees to about 80 degrees.

Figure 10:
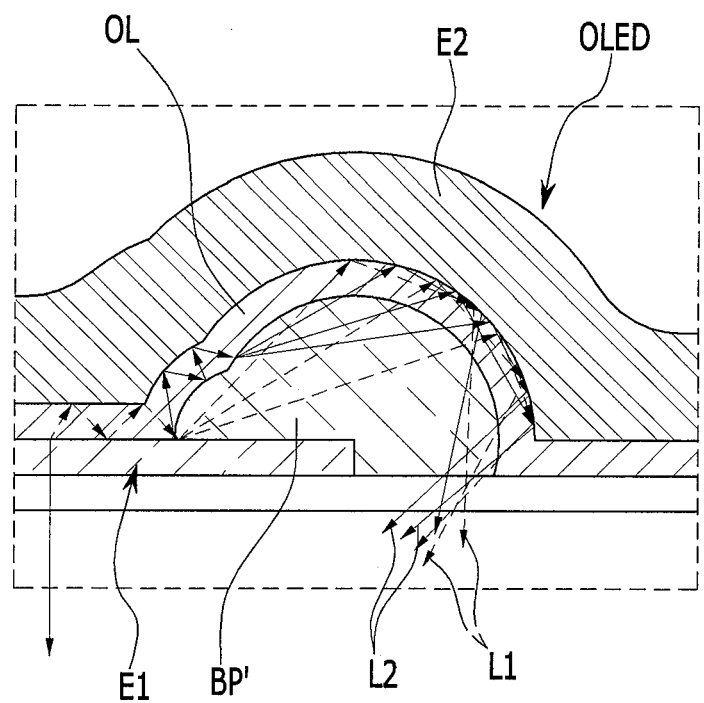
FIG. 10 is a schematic cross-sectional view showing a light path of light emitted from an organic emission layer shown in FIG. 9.

FIG. 10 is a schematic view showing a light path of a light emitted from an organic emission layer shown in FIG. 9.

As shown in FIG. 10, the first light L1 among the light emitted from the organic emission layer OL of the organic light emitting diode (OLED) display 1002 according to the second exemplary embodiment is reflected (e.g., continuously reflected) between the first electrode E1 and the second electrode E2 and is emitted into the bump BP' at the side of the organic emission layer OL. The first light L1 emitted in the first sub-curved surface BPSS1 of the bump BP' at the side of the organic emission layer OL is diffused in the interface of the first sub-curved surface BPSS1 of the bump BP' having a small refractive index compared with the organic emission layer OL and is irradiated into the second electrode E2 that is on the bump BP'. According to an embodiment of the present invention, by positioning the second electrode E2 (which is the reflective electrode) on the bump BP', the first diffused light L1 is reflected by the second electrode E2 and is irradiated to the center of the pixel without a luminance deterioration by the organic emission layer OL and the first electrode E1.

Also, according to an embodiment of the present invention, the second light L2 is emitted to the first sub-curved surface BPSS1 of the bump BP' at the side of the organic emission layer OL. The second light L2 is reflected by the first sub-curved surface BPSS1 of the bump BP' by the refractive index difference of the organic emission layer OL and the bump BP', is reflected by the second electrode E2, and is diffused in the interface of the second sub-curved surface BPSS2 of the bump BP', and as a result, the second light L2 is irradiated onto the second electrode E2 positioned on the bump BP'. By positioning the second electrode E2 (which is the reflective electrode) on the bump BP', according to an embodiment of the present invention, the diffused second light L2 is reflected by the second electrode E2 and is irradiated into the center of the pixel without a luminance deterioration by the organic emission layer OL and the first electrode E1.

As described above, the first light L1 and the second light L2 irradiated from the organic emission layer OL may be diffused into the interface of the first sub-curved surface BPSS1 of the bump BP' and the second sub-curved surface BPSS2, may be reflected by the second electrode E2 to be irradiated to the center of the pixel, and thereby, the entire luminous efficiency of the organic light emitting diode (OLED) display 1002 is improved.

That is, in the organic light emitting diode (OLED) display 1002 according to the second exemplary embodiment, the first light L1 and the second light L2 irradiated from the side of the organic emission layer OL are reflected into the center of the pixel by the second electrode E2 without luminance deterioration by the organic emission layer OL and the second electrode E2, such that the entire luminous efficiency is improved.

Next, an organic light emitting diode (OLED) display according to the third exemplary embodiment will be described with reference to FIG. 11 and FIG. 12.

Hereinafter, only the elements or features that are different from the second embodiment will be described in detail, and the other elements are given by way of reference to the above-described second embodiment. For better comprehension and ease of description, the third exemplary embodiment will have the same reference numerals for the same (or similar) elements of the second exemplary embodiment.

Figure 11:
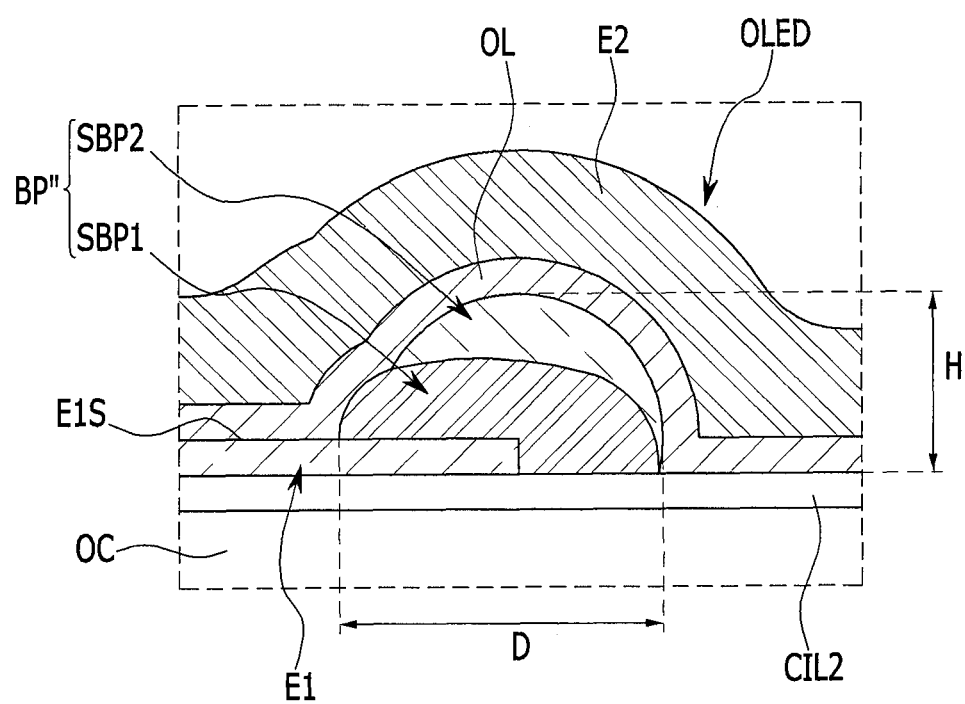
FIG. 11 is a schematic cross-sectional view partially showing an organic light emitting diode (OLED) display according to the third exemplary embodiment.

FIG. 11 is a schematic cross-sectional view of a portion of an organic light emitting diode (OLED) display according to the third exemplary embodiment.

As shown in FIG. 11, the bump BP''' of the organic light emitting element (OLED) of the organic light emitting diode (OLED) display 1003 according to the third exemplary embodiment includes a first sub-bump SBP1 having a first sub-curved surface BPSS1 and a second sub-bump SBP2 positioned on the first sub-bump SBP1 and having a second sub-curved surface BPSS2. The first sub-bump SBP1 and the second sub-bump SBP2 may have different refractive indexes.

Figure 12:
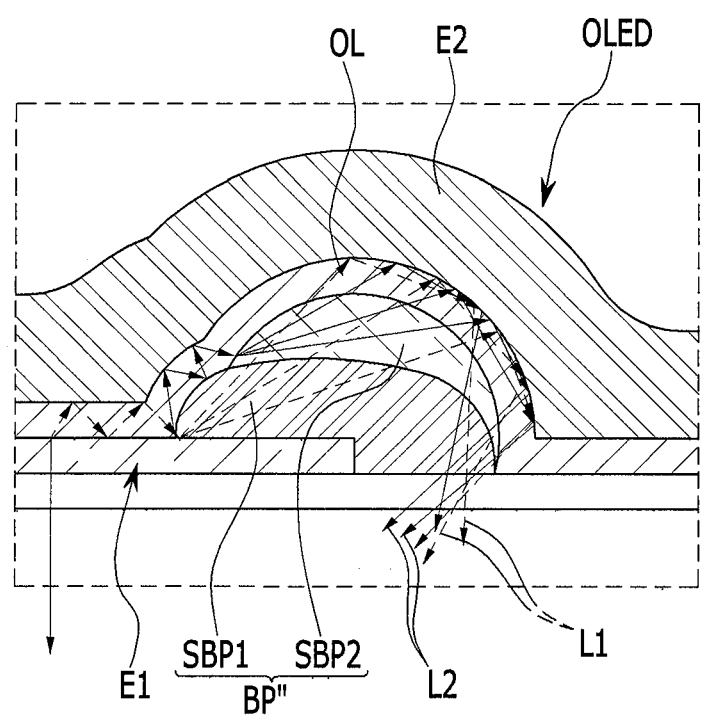
FIG. 12 is a schematic cross-sectional view showing a light path of light emitted from an organic emission layer shown in FIG. 11.

FIG. 12 is a schematic view showing a light path of light emitted from an organic emission layer shown in FIG. 11.

As shown in FIG. 12, the first light L1 among the light emitted from the organic emission layer OL of the organic light emitting diode (OLED) display 1003 according to the third exemplary embodiment is continuously reflected between the first electrode E1 and the second electrode E2 and is emitted into the bump BP positioned at the side of the organic emission layer OL. In this case, the first light L1 emitted into the first sub-curved surface BPSS1 of the first sub-bump SBP1 positioned at the side of the organic emission layer OL is diffused in the interface of the first sub-curved surface BPSS1 of the first sub-bump SBP1 (which has a small refractive index compared with the organic emission layer OL) to be irradiated onto the second electrode E2 positioned on the bump BP'''. By positioning the second electrode E2 (which is the reflective electrode) on the bump BP''', the diffused first light L1 is reflected by the second electrode E2, and is irradiated into the center of the pixel without luminance deterioration by the organic emission layer OL and the first electrode E1.

Also, the second light L2 (which is emitted into the first sub-curved surface BPSS1 of the first sub-bump SBP1 positioned at the side of the organic emission layer OL) is reflected by the first sub-curved surface BPSS1 of the first sub-bump SBP1 by the refractive index difference of the organic emission layer OL and the bump BP''', and is reflected by the second electrode E2 and is diffused at the interface of the second sub-curved surface BPSS2 of the second sub-bump SBP2 to be irradiated onto the second electrode E2 positioned on the bump BP'''. Here, by positioning the second electrode E2 (which is the reflective electrode) on the bump BP''', the diffused second light L2 is reflected by the second electrode E2 and is irradiated into the center of the pixel without luminance deterioration by the organic emission layer OL and the first electrode E1.

Furthermore, the first sub-bump SBP1 and the second sub-bump SBP2 may have different refractive indexes, and thereby, the first light L1 and the second light L2 may be reflected several times in the interface between the first sub-bump SBP1 and the second sub-bump SBP2 by the refractive index difference of the first sub-bump SBP1 and the second sub-bump SBP2 such that a resonance effect is generated between the interface between the first sub-bump SBP1 and the second sub-bump SBP2, and the second electrode E2. As a result, the luminous efficiency of the first light L1 and the second light L2 (which are irradiated in the center of the pixel) is improved.

As described above, the first light L1 and the second light L2 emitted from the organic emission layer OL are diffused and reflected in the interface of the first sub-curved surface BPSS1 of the first sub-bump SBP1 of the bump BP''' and the interface of the second sub-curved surface BPSS2 of the second sub-bump SBP2 and are reflected by the second electrode E2 to be irradiated into the center of the pixel, thereby improving the luminous efficiency of the entire organic light emitting diode (OLED) display 1003.

That is, in the organic light emitting diode (OLED) display 1003 according to the third exemplary embodiment, the first light L1 and the second light L2 (which are respectively irradiated from the side of the organic emission layer OL) generate a resonance effect without luminance deterioration by the organic emission layer OL and the first electrode E1 to be reflected into the center of the pixel by the second electrode E2, thereby improving the entire luminous efficiency.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light emitting element comprising:
a first electrode;
a bump partially covering an end of the first electrode and having an island shape, which has a thickness larger than a thickness of the first electrode;
an organic emission layer on the first electrode and the bump; and
a second electrode on the organic emission layer,
wherein the bump has a curved surface, and wherein the curved surface of the bump comprises:
a first sub-curved surface contacting a surface of the first electrode and forming a first angle with the surface of the first electrode; and
a second sub-curved surface that has a bend, extends from the first sub-curved surface, and forms a second angle with the surface of the first electrode that is larger than the first angle.

2. The organic light emitting element of claim 1, wherein the first electrode is light transmissive, and the second electrode is light reflective.

3. The organic light emitting element of claim 2, wherein the bump has a small refractive index as compared with a refractive index of the organic emission layer and a refractive index of the first electrode.

4. The organic light emitting element of claim 3, wherein the bump has a refractive index of about 1.5 to about 1.6.

5. The organic light emitting element of claim 3, wherein a thickness of the bump is in a range of about 0.8 μm to about 3.5 μm.

6. The organic light emitting element of claim 3, wherein a width of the bump is in a range of about 5 μm to about 6 μm.

7. The organic light emitting element of claim 3, wherein the first angle is in a range of about 10 degrees to about 37 degrees, and the second angle is in a range of about 38 degrees to about 80 degrees.

8. The organic light emitting element of claim 3, wherein the bump comprises:
a first sub-bump having the first sub-curved surface; and
a second sub-bump on the first sub-bump and having the second sub-curved surface.

9. The organic light emitting element of claim 8, wherein the first sub-bump and the second sub-bump have different refractive indexes.

10. The organic light emitting element of claim 1, wherein the organic emission layer is configured to emit white light.

11. The organic light emitting element of claim 1, wherein the first electrode, the organic emission layer, and the second electrode respectively have different refractive indexes.

12. An organic light emitting diode (OLED) display comprising:
a substrate; and
an organic light emitting element on the substrate and comprising:
a first electrode;
a bump partially covering an end of the first electrode and having an island shape, which has a thickness larger than a thickness of the first electrode;
an organic emission layer on the first electrode and the bump; and
a second electrode on the organic emission layer,
wherein the bump has a curved surface, and
wherein the curved surface of the bump comprises:
a first sub-curved surface contacting a surface of the first electrode and forming a first angle with the surface of the first electrode; and
a second sub-curved surface that has a bend, extends from the first sub-curved surface, and forms a second angle with the surface of the first electrode that is larger than the first angle.

13. The organic light emitting diode display of claim 12, further comprising
a color filter layer between the substrate and the organic light emitting element.

* * * * *